United States Patent [19]
Lin et al.

[11] Patent Number: 5,990,015
[45] Date of Patent: Nov. 23, 1999

[54] DUAL DAMASCENCE PROCESS

[75] Inventors: Tony Lin, Kao Hsiung Hsien; Yimin Huang, Taichung Hsien; Tri-Rung Yew, Hsinchu Hsien, all of Taiwan

[73] Assignee: United Microelectronics Corp., Hsinchu, Taiwan

[21] Appl. No.: 09/041,567

[22] Filed: Mar. 12, 1998

[30] Foreign Application Priority Data

Dec. 20, 1997 [TW] Taiwan ................................. 86119415

[51] Int. Cl.⁶ .................................................. H01L 21/44
[52] U.S. Cl. ............................................. 438/706; 438/742
[58] Field of Search ................................... 438/622, 523, 438/742, 706

[56] References Cited

U.S. PATENT DOCUMENTS

| | | | |
|---|---|---|---|
| 5,466,639 | 11/1995 | Ireland | 438/633 |
| 5,518,963 | 5/1996 | Park | 438/624 |
| 5,741,626 | 4/1998 | Jain et al. | 430/314 |

*Primary Examiner*—Benjamin Utech
*Assistant Examiner*—Lynette T. Umez-Eronini

[57] ABSTRACT

A dual damascene process can be used to form an interconnect. A first dielectric layer is formed on a semiconductor substrate having a device layer formed thereon. A stop layer is formed on the first dielectric layer and a second dielectric layer is formed on the stop layer. A hard mask layer is formed and patterned on the second dielectric layer so that an opening is formed to expose the second dielectric layer therewithin. The second dielectric layer, the stop layer and a part of the first dielectric layer are etched within the opening by photolithography and etching, so that a contact window is formed. Using the hard mask layer as a hard mask, an etching is performed so that a metal trench penetrating through the second dielectric layer is formed, and the device layer within the contact window is exposed.

21 Claims, 6 Drawing Sheets

DUAL DAMASCENCE PROCESS

CROSS-REFERENCE TO RELATED APPLICATION

This application claims priority benefit of Taiwan application Serial no.86119415, filed Dec., 20, 1997, the full disclosure of which is incorporated herein by reference.

BACKGROUND OF THE INVENTION

1. Field of the Invention

The invention relates to a method of fabricating a metal interconnect, and more particularly to a method of dual damascene process by using a hard mask.

2. Description of the Related Art

In many highly integrated semiconductor devices, more than two levels of interconnecting metal layers are called multilevel interconnects. The formation of multilevel interconnects are to support the three dimensional wiring line structure required by high density of devices. In the process of fabricating multilevel interconnects, a first level, or a lower level of metal wiring and interconnect are formed first, and a second metal wiring is formed afterwards to connect the first metal wiring and the interconnect. The first metal wiring includes a poly-silicon layer or a metal layer, which electrically connects the source/drain region of device formed in the substrate. The electrical connection between the substrate and the device in the substrate is performed by a via or a contact. Electrical connections between devices are performed by a second or a higher layer of metal wiring.

A dual damascene process is intensively developed to provide a more stable and more advanced method of fabricating interconnects in an integrated circuit (IC). By using chemical-mechanical polishing process (CMP) during dual damascene process, a greater variety of metals such as aluminum, copper and aluminum alloy can be selected without being restricted by the conventional etching process. Selecting from a greater variety of metals is advantageous to the requirement of a low resistance interconnects, and is also advantageous to prevent electromigration. Therefore, dual damascene process will be broadly applied in the fabrication process of very large semiconductor integration (VLSI) interconnects under 0.25 $\mu$m technology.

In FIG. 1A to FIG. 1C, a conventional dual damascene process is shown. Referring to FIG. 1A, on a semiconductor substrate 10 comprising a metal wiring 11, a dielectric layer 12 such as a silicon oxide layer having a thickness of about 10000 Å to 17000 Å is formed, for example, by chemical vapour deposition (CVD). Using a first step of photolithography and etching with the etching time controlled, a metal trench 13 and 14 are formed within the dielectric layer 12. The etching time is controlled to define the depth of the predetermined second metal trench. However, the uniformity of trench depth across all wafer is difficult to control. Also, a ragged and uneven surface 15 is easily formed on the bottom of the metal trench 13 and 14 due to plasma etch.

Referring to FIG. 1B, a second step of photolithography and etching is performed. The contact window 16 is further etched to expose the metal wiring 11 therewithin.

Referring to FIG. 1C, the metal trench 13, 14 and the contact window 16 are filled with a conductive material. A glue layer is formed over the substrate 10 before the formation of the conductive material. Using CVD, the conductive material is then formed on the glue layer and fills the metal trench 13, 14 and the contact window 16. The unwanted part of the conductive layer is removed either by etching back or polishing. A second metal wiring, that is, 13a and 14a, are formed. The second metal wiring 14a is coupled with the metal wiring 11 by the contact 16.

In the above dual damascene, during the second step of photolithography and etching, a ragged and uneven surface is easily formed on surface of the bottom of the metal trench. The resolution of photolithography is seriously degraded.

To improve the resolution of photolithography and control the metal trench depth in the above process, another dual damascene process is disclosed. Referring to FIG. 2A, on a semiconductor substrate 20 comprising a metal wiring 21, a first dielectric layer 22 having a thickness of about 5000 Å to 10000 Å is formed. A thin silicon nitride layer 23 is then formed on the first dielectric layer 22 to serve as a stop layer for the subsequent etching process. The silicon nitride layer 23 is defined to form a contact window 24 which is formed in alignment with and on top of the metal wiring 21.

Referring to FIG. 2B, a second dielectric layer 25 is formed on the silicon nitride layer 23. A preferable second dielectric layer 25 includes a silicon oxide layer, and has a different etching rate with the silicon nitride layer 23. The second dielectric layer 25 has a thickness of about 5000 Å to 8000 Å, the same as the thickness of the predetermined second metal wiring.

Referring to FIG. 2C, using photolithography and etching process, the contact window 26 and metal trenches 27, 28 are formed within the second dielectric layer 25. Within the metal trenches 27 and 28, with the silicon nitride layer 23 as a stop layer, the etching process is stopped thereupon.

Referring to FIG. 2D to FIG. 2E, a contact 26a and interconnect 27a and 28a are formed within the contact window 26 and the metal trenches 27a, 28a, respectively. A second metal wiring is coupled with the metal wiring 21 by the contact 26a.

During etching, a high etch selectivity for the stop layer, that is, the silicon nitride layer, is required to control the thickness of the interconnects 27a and 28a. In addition, since the etch selectivity of silicon nitride is to be considered, the width of the lower part of the contact window 26a is narrower as shown in FIG. 2E. Thus, the contact resistance is increased with the reduction of contact area.

SUMMARY OF THE INVENTION

It is therefore an object of the invention to provide a dual damascene process. In the dual damascene process according to the invention, the disadvantages of the conventional process are improved.

To achieve these objects and advantages, and in accordance with the purpose of the invention, as embodied and broadly described herein, the invention is directed towards a dual damascene process. A first dielectric layer is formed on a semiconductor substrate having a device layer formed thereon. A stop layer is formed on the first dielectric layer and a second dielectric layer is formed on the stop layer. A hard mask layer is formed and patterned on the second dielectric layer, so that an opening is formed to expose the second dielectric layer therewithin. The second dielectric layer, the stop layer and a part of the first dielectric layer are etched within the opening by photolithography and etching, so that a contact window is formed. Using the hard mask layer as a hard mask, an etching is performed so that a metal trench penetrating through the second dielectric layer is formed, and the device layer within the contact window is exposed.

It is to be understood that both the foregoing general description and the following detailed description are exemplary and explanatory only and are not restrictive of the invention as claimed.

DESCRIPTION OF THE PREFERRED EMBODIMENTS

In the invention, a hard mask layer, for example, a silicon nitride layer is formed during the dual damascene process. A pattern is defined on the hard mask layer by etching process. Using photolithography and etching, a contact window and a metal trench are formed with the hard mask layer as a hard mask. The width of the contact window is not narrowed, and the etch selectivity need not be very high. Therefore, a very stable interconnect is formed. After etching, most of the hard mask layer is removed simultaneously.

Figure 1A:
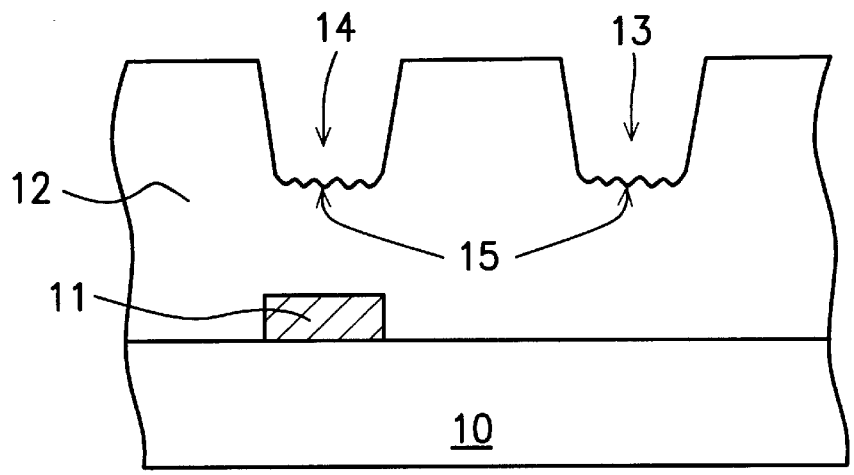
FIG. 1A to FIG. 1C show the cross sectional view of a conventional dual damascence process.
Figure 1B:
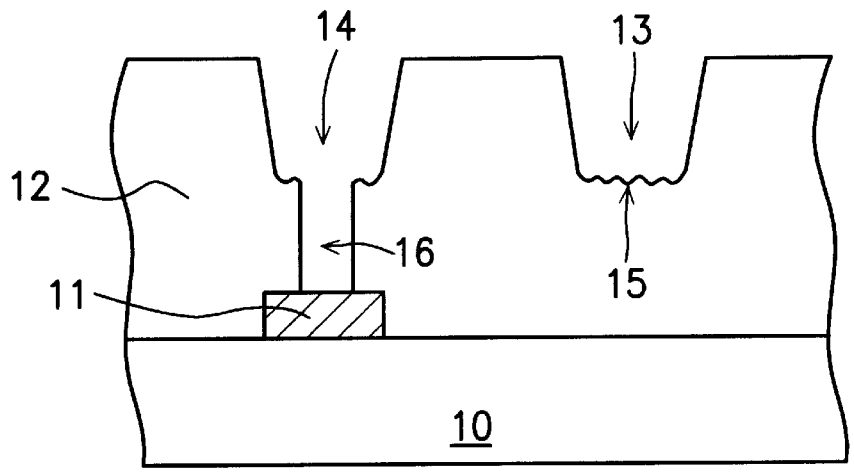
Figure 1C:
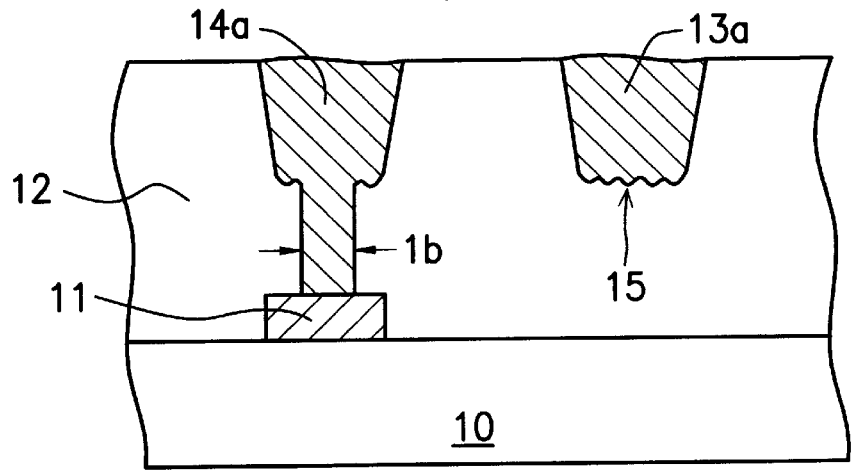
Figure 2A:
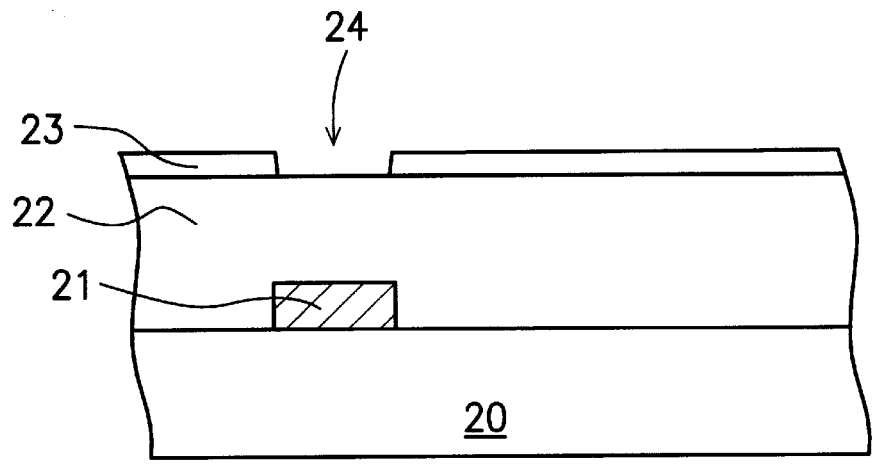
FIG. 2A to FIG. 2E show the cross sectional views of another conventional damascene process.
Figure 2B:
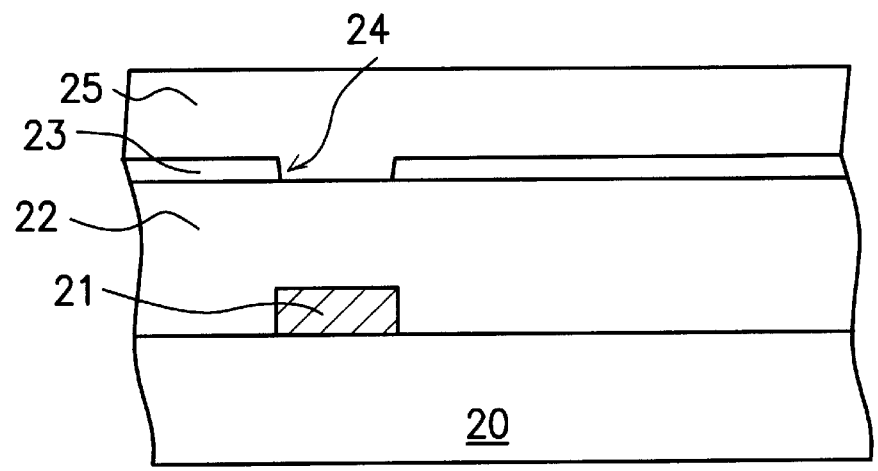
Figure 2C:
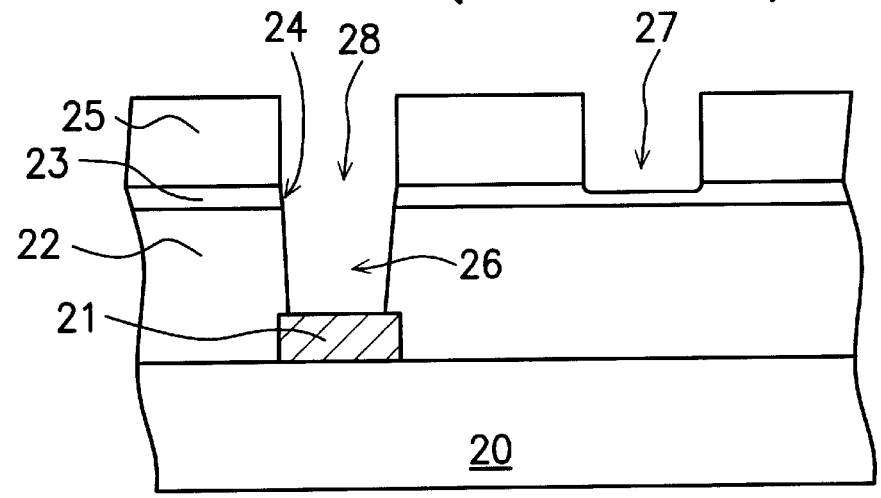
Figure 2D:
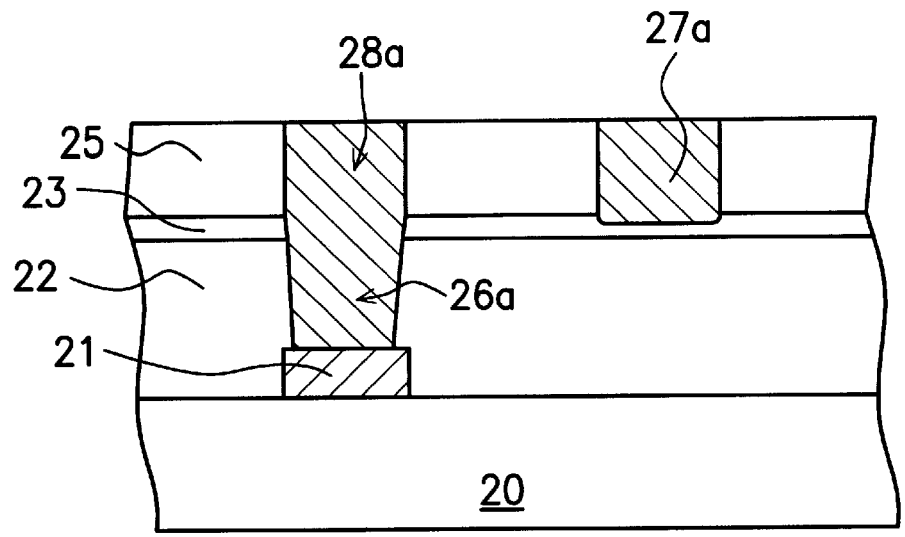
Figure 2E:
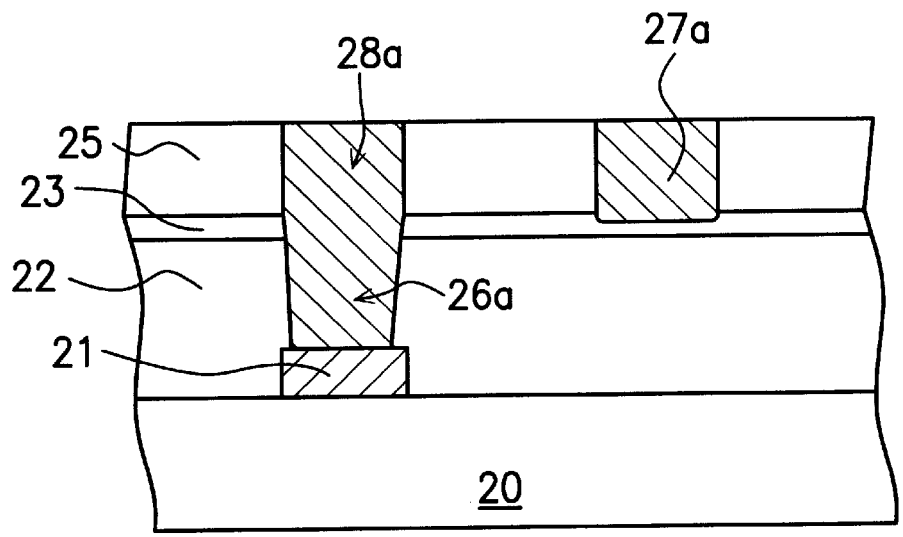
Figure 3A:
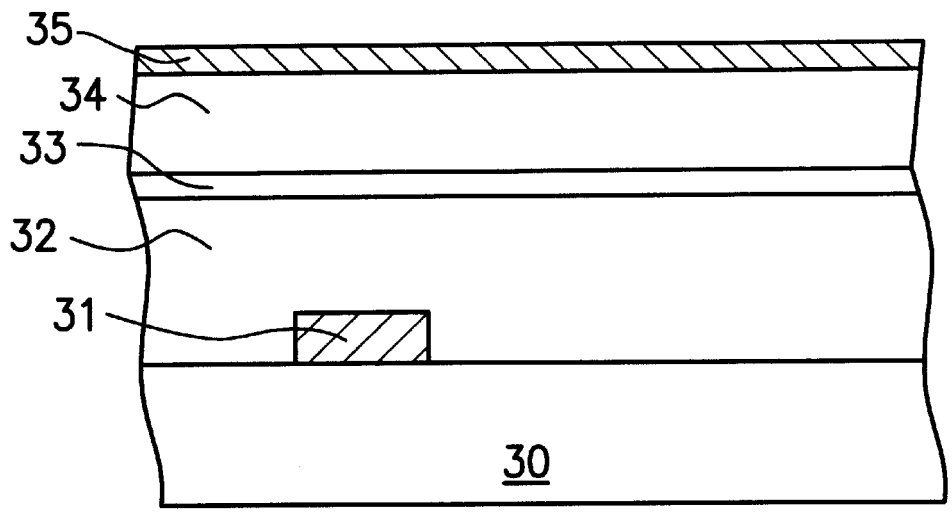
FIG. 3A to FIG. 3E are cross sectional views of a dual damascene process in a preferred embodiment according to the invention.

Referring FIG. 3A, on a semiconductor 30 comprising a first metal wiring 31 or a transistor, a first dielectric layer 32 is formed. A preferable first dielectric layer includes a silicon oxide layer formed by plasma enhanced CVD (PECVD), atmospheric pressure CVD (APCVD), or low pressure CVD (LPCVD), using silane and tetra-ethyl-oxy-silicate as reacting gases. The first dielectric layer has a thickness, for example, 7000 Å to 10000 Å, which is adjustable and depends on the surface structure of the semiconductor substrate 30. A planarization process such as etch back or CMP is performed. A stop layer 33, for example, a silicon nitride layer having a thickness of about 300 Å to 500 Å, is formed on the first dielectric layer 32. A second dielectric layer 34 is formed on the stop layer 33. A preferable second dielectric layer 34 includes a silicon oxide layer having a thickness of about 5000 Å to 8000 Å which is formed by the same method as the first dielectric layer 32. A hard mask layer 35 is formed on the second dielectric layer 34. The formation of the hard mask layer 35 is one of the main characteristics of the invention. The hard mask layer 35 is thicker than the stop layer 33, but is thinner than the first dielectric layer 32 or the second dielectric layer 34.

Figure 3B:
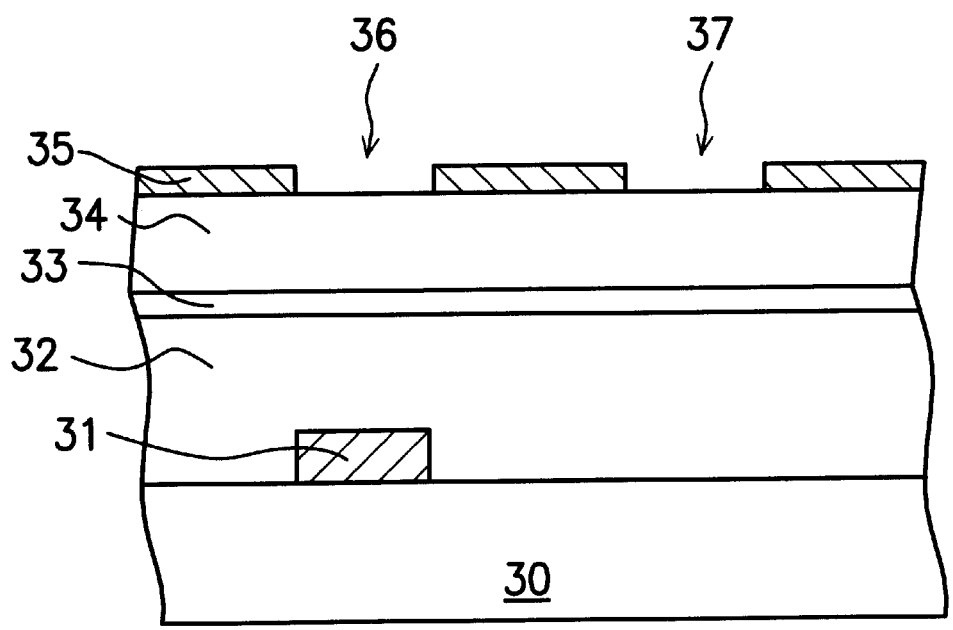

Referring to FIG. 3B, a photo-resist layer is formed and patterned on the hard mask layer 35. Using the photo-resist layer as a mask, the hard mask layer is etched to form two metal trench openings 36 and 37 in which the second dielectric layer 34 is exposed. The photo-resist layer is removed.

Figure 3C:
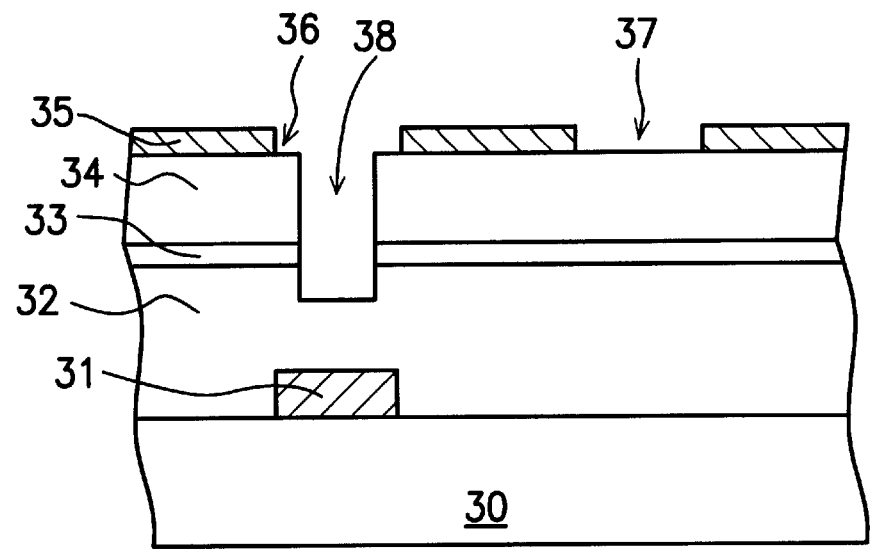

Referring to FIG. 3C, using photolithography and etching, the second dielectric layer 34, the stop layer 33, and a part of the first dielectric layer 32 within the opening 36 are etched to form a contact window 38.

Figure 3D:
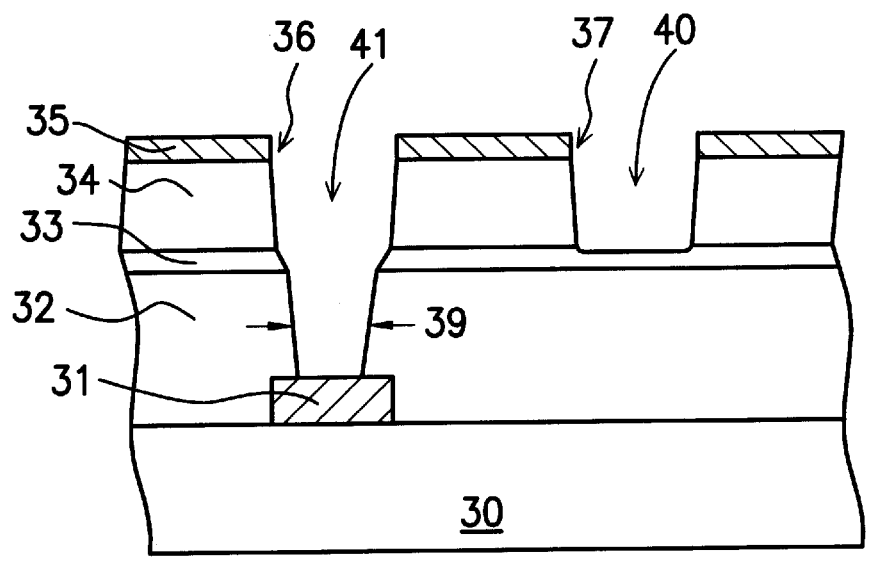

Referring to FIG. 3D, in a second etching step performed with the hard mask layer 35 as a mask, the first dielectric within the contact window 38 is further etched to form a contact window 39, so that the first metal wiring 31 is exposed within the contact window 39. Simultaneously, the second dielectric layer 34 within the other opening 37 is etched until the stop layer 33 is exposed. Thus, metal trenches 40 and 41 are formed. In the second etching step, an etchant, for example, a mixture of $C_4F_8$ and CO or $CF_4$ with other gases such as $CHF_3$, Ar, or $N_2$ without a high selectivity between silicon oxide and silicon nitride is used. In addition, after most of the mask layer is removed during etching, the capacitance of the interconnect is not affected.

Figure 3E:
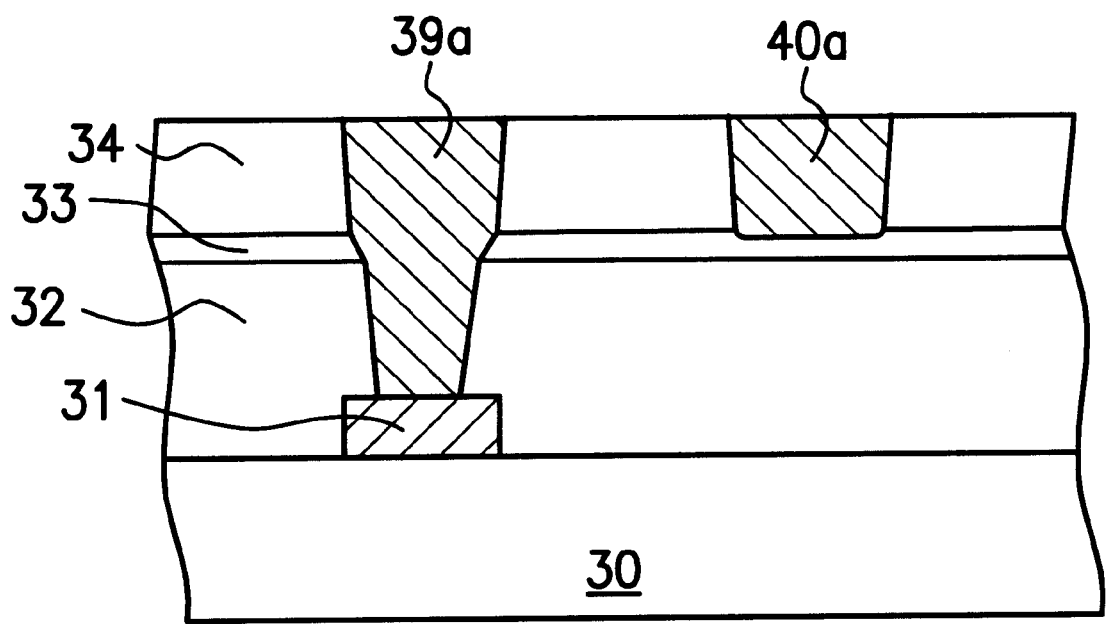

Referring to FIG. 3E, a conductive layer is formed over the substrate 30 and fills the contact window 39 and the metal trenches 40, 41. A preferable conductive layer includes a metal layer such as an aluminium layer formed by sputtering or CVD. The conductive layer is then polished, for example, by CMP, to form second metal wiring 39a and 40a.

The invention is not restricted to two-level metal wiring only. For multilevel interconnection, a similar process according to the invention can be applied.

The characteristics of the invention are as follows:

(1) The formation of an additional hard mask layer which is used as a hard mask for the subsequent etching process. A better topography of a metal trench or a contact window is obtained.

(2) During the process of fabricating the first metal wiring 31 and the second metal wring 39a and 40a, two steps of etching are used. The contact window is defined by the first etching step. While patterning the metal trench by the second etching step, the contact window is deepened by etching the dielectric layer therewithin until the first metal wiring is exposed. Therefore, the selectivity of the etchant in the invention is not as high as in the conventional process, and a very stable interconnect is obtained.

(3) The width of the contact window interconnecting two metal layers can be adjusted as accurately as required. The issue of photolithography resolution for contact window is minimized since the wafer surface roughness formed by using a planarized mask is small than that of a conventional dual damascene process.

(4) The invention is not restricted for application in two-level interconnection. It can also be applied in multilevel interconnection.

Other embodiments of the invention will appear to those skilled in the art from consideration of the specification and practice of the invention disclosed herein. It is intended that the specification and examples considered as exemplary only, with the true scope and spirit of the invention being indicated by the following claims.

What is claimed is:

1. A dual damascene process, wherein a semiconductor substrate having a device layer formed thereon is provided, the process comprising:

forming a first dielectric layer on the substrate;

forming a stop layer on the first dielectric layer;

forming a second dielectric layer on the stop layer;

forming a patterned hard mask layer on the second dielectric layer, so that a first opening and a second opening are formed to expose the second dielectric layer;

pattering the second dielectric layer, the stop layer and a part of the first dielectric layer within the first opening, so that a third opening is formed within the first opening without exposing the device layer; and performing an etching process by using the hard mask layer with the first and second openings as an etching mask, so that a fourth opening about under the second opening is formed to expose the stop layer, and a damascene opening within the first opening is formed to expose the device layer, wherein the stop layer serves as a full etching mask layer or a substantial etching mask layer for the etching process.

2. The process according to claim 1, wherein the device layer comprises a metal wiring layer.

3. The process according to claim 1, wherein the device layer comprises a transistor.

4. The process according to claim 1, wherein the first dielectric layer includes a silicon oxide layer.

5. The process according to claim 1, wherein the stop layer includes a silicon nitride layer.

6. The process according to claim 1, wherein the second dielectric layer includes a silicon oxide layer.

7. The process according to claim 1, wherein the hard mask layer includes a silicon nitride layer.

8. The process according to claim 1, further comprising forming and polishing a conductive layer within the damascene opening and the fourth opening.

9. The method according to claim 8, wherein the conductive layer is polished by chemical-mechanical polishing.

10. The method according to claim 1, wherein the mask layer is thicker than the stop layer.

11. A dual damascene process, wherein a semiconductor substrate having a metal wiring layer formed thereon is provided, the process comprising:

forming a first dielectric layer on the substrate;

forming a stop layer on the first dielectric layer;

forming a second dielectric layer on the stop layer;

forming a patterned hard mask layer on the second dielectric layer, so that a first opening aligned with the metal wiring layer and a second opening are formed to expose the second dielectric layer therewithin;

etching the second dielectric layer, the stop layer and a part of the first dielectric layer within the first opening by photolithography and etching, so that a contact window is formed but without exposing the metal wiring layer yet;

performing an etching process by using the hard mask layer as an etching mask, so that a third opening is formed within the second opening to expose the stop layer, and the first dielectric layer is further etched to form a damascene opening that exposes the metal wiring layer, wherein a portion of the stop layer within the first opening serves as an etching mask layer for the etching process to etch the first dielectric layer; and forming a conductive over the substrate so as to fill the damascene opening and the third opening.

12. The process according to claim 11, wherein the first dielectric layer includes a silicon oxide layer.

13. The process according to claim 11, wherein the stop layer includes a silicon nitride layer.

14. The process according to claim 11, wherein the second dielectric layer includes a silicon oxide layer.

15. The process according to claim 11, wherein the hard mask layer includes a silicon nitride layer.

16. The process according to claim 11, further comprising a polishing after the forming the conductive layer.

17. The method according to claim 16, wherein the conductive layer is polished by chemical-mechanical polishing.

18. The method according to claim 11, wherein the mask layer is thicker than the stop layer.

19. The process according to claim 1, wherein the first opening and the second opening comprises a trench-like structure, and a portion of the damascene opening in the first dielectric layer comprises a hole-like opening.

20. The process according to claim 11, wherein the first opening and the second opening comprises a trench-like structure, and a portion of the damascene opening in the first dielectric layer comprises a hole-like opening.

21. A dual damascene process, wherein a semiconductor substrate having a device layer formed thereon is provided, the process comprising:

forming a first dielectric layer on the substrate;

forming a stop layer on the first dielectric layer;

forming a second dielectric layer on the stop layer;

forming a patterned hard mask layer on the second dielectric layer, so that a first opening is formed to expose the second dielectric layer;

pattering the second dielectric layer, the stop layer and a part of the first dielectric layer within the first opening so that a second opening is formed within the first opening without exposing the device layer yet; and performing an etching process, using the hard mask layer as an etching mask, so that the second opening is further extended to formed a damascene opening that exposes the device layer, wherein the stop layer serves as a full etching mask layer or a substantial etching mask layer for the etching process.

* * * * *